(12) United States Patent
Goldfarb

(10) Patent No.: US 9,915,867 B2
(45) Date of Patent: Mar. 13, 2018

(54) MECHANICAL ISOLATION CONTROL FOR AN EXTREME ULTRAVIOLET (EUV) PELLICLE

(71) Applicant: INTERNATIONAL BUSINESS MACHINES CORPORATION, Armonk, NY (US)

(72) Inventor: Dario L. Goldfarb, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 48 days.

(21) Appl. No.: 14/864,318

(22) Filed: Sep. 24, 2015

(65) Prior Publication Data
US 2017/0090281 A1  Mar. 30, 2017

(51) Int. Cl.
B24B 11/00 (2006.01)
G03F 1/82 (2012.01)
G03F 1/62 (2012.01)

(52) U.S. Cl.
CPC . *G03F 1/82* (2013.01); *G03F 1/62* (2013.01)

(58) Field of Classification Search
CPC .. B25B 1/00; B25B 5/00; B25B 11/00; B25B 11/002
See application file for complete search history.

(56) References Cited

U.S. PATENT DOCUMENTS

| 5,793,836 | A  | 8/1998 | Maldonado et al. |
| 6,180,292 | B1 | 1/2001 | Acosta et al. |
| 6,492,067 | B1 | 12/2002 | Klebanoff et al. |
| 6,544,693 | B2 | 4/2003 | Levinson et al. |
| 6,566,018 | B2 | 5/2003 | Muzio et al. |
| 6,626,742 | B2 * | 9/2003 | Trommer ............... B24B 1/005 451/36 |
| 6,811,936 | B2 | 11/2004 | Smith et al. |
| 6,906,783 | B2 | 6/2005 | del Puerto et al. |
| 6,912,043 | B2 | 6/2005 | Galburt |
| 7,102,127 | B2 | 9/2006 | Ramamoorthy et al. |
| 7,136,151 | B2 | 11/2006 | Lenox et al. |
| 7,169,253 | B2 | 1/2007 | Chen et al. |
| 7,537,114 | B2 | 5/2009 | Gallagher et al. |

(Continued)

OTHER PUBLICATIONS

Kim, et al., "Large-Scale Freestanding Nanometer-Thick Graphite Pellicles for Mass Production of Nanodevices Beyond 10 nm†", The Royal Society of Chemistry, Jun. 2015, pp. 1-4.

(Continued)

*Primary Examiner* — Lee D Wilson
(74) *Attorney, Agent, or Firm* — Tutunjian & Bitetto, P.C.; Vazken Alexanian

(57) ABSTRACT

Systems and methods for isolating a membrane during fabrication. The membrane is connected to a substrate wafer using a plurality of magnets of uniform dimensions formed into two or more magnet stack beams. The magnet stack beams provide a gap between the wafer and the membrane. The wafer connected to the membrane by the magnet stack beams is received by a substrate holder so that a space is present between the membrane and the substrate holder. The membrane is rinsed by immersing, soaking, and withdrawing the substrate holder and the wafer connected to the membrane by the magnet stack beams using a rinse bath solution.

20 Claims, 5 Drawing Sheets

(56) References Cited

U.S. PATENT DOCUMENTS

| | | | |
|---|---|---|---|
| 7,723,704 | B2 | 5/2010 | Wood, II et al. |
| 7,767,985 | B2 | 8/2010 | Okoroanyanwu et al. |
| 7,951,513 | B2 | 5/2011 | Kubota et al. |
| 8,002,899 | B2 | 8/2011 | Wu et al. |
| 8,518,612 | B2 | 8/2013 | Akiyama et al. |
| 9,057,957 | B2 | 6/2015 | Goldfarb |
| 2002/0023507 | A1* | 2/2002 | Hajduk ................ B01L 3/5085 73/866 |
| 2008/0211061 | A1* | 9/2008 | Atwater, Jr. ........ H01L 21/2007 257/615 |
| 2009/0258159 | A1 | 10/2009 | Su et al. |
| 2012/0088188 | A1* | 4/2012 | Trefonas ............. B81C 1/00031 430/270.1 |
| 2012/0183757 | A1 | 6/2012 | Akiyama et al. |
| 2013/0250260 | A1 | 9/2013 | Singh |
| 2014/0160455 | A1 | 6/2014 | Yakunin et al. |
| 2014/0367248 | A1 | 12/2014 | Goldfarb |
| 2014/0370423 | A1 | 12/2014 | Goldfarb |

OTHER PUBLICATIONS

Scaccabarozzi, et al., "Investigation of EUV Pellicle Feasibility", Extreme Ultraviolet (EUV) Lithography IV, Proc. of SPIE vol. 8679, 867904, Apr. 2013, 12 pages, vol. 8679.

Zoldesi, et al., "Progress on EUV Pellicle Development", Extreme Ultraviolet (EUV) Lithography V, Proc. of SPIE, Apr. 2014, 10 pages, vol. 9048, 90481N.

Anonymous, "Multiple Member EUV Pellicle Packaging Assembly", An IP.com Prior Art Database Technical Disclosure, Feb. 2015, pp. 1-6.

\* cited by examiner

MECHANICAL ISOLATION CONTROL FOR AN EXTREME ULTRAVIOLET (EUV) PELLICLE

BACKGROUND

Technical Field

The present invention relates to Extreme Ultraviolet (EUV) pellicle fabrication, and more particularly to a mechanical isolation control for an EUV pellicle during EUV pellicle fabrication.

Description of the Related Art

During semiconductor wafer fabrication, extreme ultraviolet (EUV) light may be employed in, for example, a lithographic process to enable transfer of very small patterns (e.g., nanometer-scale patterns) from a mask to a semiconductor wafer. In EUV lithography, a pattern formed on an EUV lithographic mask (e.g., EUV reticle) may be transferred to a semiconductor wafer by reflecting EUV light off of portions of a reflective surface. A pellicle can be placed in front of the mask to, for example, avoid contamination of the mask and to prevent unwanted particles from reaching the mask surface, which may enable avoidance of alteration of the pattern to be transferred by the mask.

The fabrication of a pellicle (e.g., membrane) suitable for EUV imaging may be accomplished by selectively etching a silicon wafer including the pellicle material layer to create the desired free-standing membrane (e.g., pellicle). This subtractive method may employ wet processing methods and/or chemicals, and as such, the ultra-thin unsupported film (e.g., pellicle) needs to be able to withstand any forces exerted on its surface during the etch and rinse steps without breaking. In the case of EUV mask technology, as pellicles are conventionally very thin (e.g., ~100 nm or less), managing the mechanical stability of the ultra-thin pellicle membrane in the presence of outside forces during fabrication is challenging, especially given the large surface area with respect to the thickness of an EUV pellicle. Outside forces may include, for example, mechanical vibrations (e.g., induced during manual pellicle handling, by moving parts that assist with controlled motorized translation), liquid and/or air pressure differentials on either side of the membrane (e.g., due to forced or natural convection), and/or capillary forces (e.g., due to meniscus formation at the liquid-air interface).

SUMMARY

A membrane holder is provided, and includes a substrate wafer. A plurality of magnets of uniform dimensions are formed into two or more magnet stack beams for connecting a membrane to the wafer. The magnet stack beams provide a gap between the wafer and the membrane when the membrane is connected. A substrate holder is configured to receive the wafer, and the magnet stack beams are positioned on the wafer so that a space is present between the membrane and the substrate holder when the membrane is connected for rinsing.

A method for isolating a membrane during fabrication. The membrane is connected to a substrate wafer using a plurality of magnets of uniform dimensions formed into two or more magnet stack beams, and the magnet stack beams provide a gap between the wafer and the membrane. The wafer connected to the membrane by the magnet stack beams is received by a substrate holder so that a space is present between the membrane and the substrate holder. The membrane is rinsed by immersing, soaking, and withdrawing the substrate holder and the wafer connected to the membrane by the magnet stack beams using a rinse bath solution.

A method for rinsing a plurality of membranes during fabrication, including connecting a membrane to a substrate wafer using a plurality of magnets of uniform dimensions formed into two or more magnet stack beams. The magnet stack beams provide a gap between the wafer and the membrane. The wafer connected to the membrane by the magnet stack beams is received by a substrate holder so that a space is present between the membrane and the substrate holder. One or more barriers are connected to the substrate holder by interposing the one or more barriers between adjacent membranes. The membranes are rinsed by immersing, soaking, and withdrawing the substrate holder and the wafer affixed to the membranes by the magnet stack beams using a rinse bath solution.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
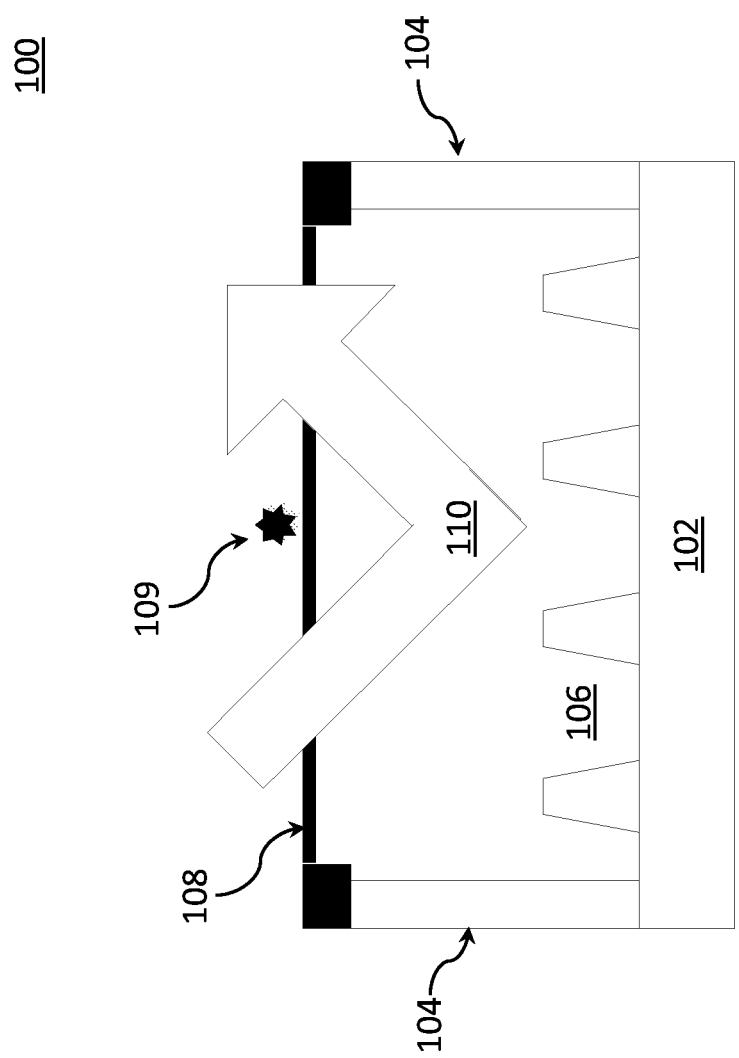
FIG. 1 shows an exemplary system employing a pellicle (e.g., extreme ultraviolet (EUV) pellicle) for lithography, in accordance with one illustrative embodiment of the present principles.

The present principles are directed to systems and methods for controlling mechanical perturbations during pellicle (e.g., EUV pellicle) fabrication. In a particularly useful embodiment, a glass wafer and magnets may be employed as ancillary supporting structures for one or more EUV pellicles. The EUV pellicle may be affixed to the glass wafer using, for example, magnets which provide a desired gap between the EUV pellicle membrane and wafer surfaces according to the present principles.

In one embodiment, the glass wafer may be, for example, 200 mm in diameter and may be resistant to a Potassium Hydroxide (KOH) attack. Magnets may be employed to mount the EUV pellicle, and may be based on, for example, Iron-Neodymium-Boron alloys (e.g., FeNdB, "rare earth magnets") and can be coated with a hydrophilic corrosion-resistant layer (e.g., Nickel), which may provide sufficient protection against oxidation and dissolution in KOH. Several magnets may be assembled together (e.g., in a magnet stack) by alternating their magnetic poles (e.g., +−+−+− . . . ) to create a gap between the pellicle and the wafer ranging from, for example, 10-20 mm. Mechanical isolation may be achieved using the system and method according to the present principles (described in further detail herein below), as any mechanical vibration generated on the glass wafer would not efficiently propagate through the magnet stack to the pellicle frame according to various embodiments.

Advanced patterning techniques (e.g., KrF (248 nm), ArF (193 nmm, etc.)) for lithography may employ projection-reduction imaging systems that make use of a photomask (e.g., including the physical image to transfer the desired layout to a semiconductor substrate (e.g., wafer)). To enable a faithful image transfer, physical images/patterns present on the photomask should be free of defects or particulates to avoid the image printing of such foreign material (FM) onto the photoresist layer during lithographic exposure.

As such, the semiconductor industry has adopted the use of protective pellicles for a plurality of lithographic wavelengths, and a protective pellicle may be fabricated according to various embodiments of the present principles (described in further detail herein below). A pellicle may include a thin (e.g., ~1 micron) polymeric film (e.g., nitrocellulose, Polytetrafluoroethylene (PTFE) (e.g., forms of Teflon™, etc.), and may be mounted on a supporting frame which is glued to the photomask, resting at a short distance (e.g., ~6 mm) away from the mask surface. At this distance, any foreign material (FM) that lands on the pellicle surface will be located far enough away from the focal plane during the image transfer process so that it will not create a foreign pattern on the photoresist layer.

In one embodiment, the area of a commercial pellicle may be commensurate to the size of a production photomask (e.g., 6×6 inches), and needs to be highly transparent to the imaging wavelength, relatively tensile to avoid wrinkling or sagging, and resistant to radiation damage. The pellicle has become an integral component in the manufacturing process for most Integrated Circuit (IC) manufacturers and high-resolution projection photolithography systems used in, for example, the manufacturing of thin film magnetic reading heads, liquid crystal display (LCD) flat panels, micro electromechanical system (e.g., MEMS), etc.

In one embodiment, pellicles, as fabricated using the present principles, may also be employed during EUV lithography (e.g., wavelength equal to 13.5 nm), which is a prospective lithographic technique (e.g., for 7 nm semiconductor technology node and beyond). However, a pellicle material that is suitable for EUV applications may use of extremely thin layers due to the strong absorption of EUV radiation by dense matter. For example, an EUV pellicle based on silicon or silicon nitride may achieve 90% transparency for the single pass of an EUV ray of light by employing a thicknesses of 50 nm or 15 nm, respectively.

Several EUV pellicle materials may be employed, including, for example, polycrystalline silicon, monocrystalline silicon, graphitic carbon, carbon nanotubes, etc. according to various embodiments of the present principles.

In one embodiment, fabrication of a pellicle suitable for EUV imaging may be performed by selectively etching a wafer (e.g., silicon) including a pellicle material layer to create a desired free standing membrane (e.g., pellicle). This subtractive method may employ wet processing methods and chemicals, so that the ultra-thin unsupported film (e.g., pellicle) is able to withstand forces exerted on its surface during etching and rinsing without breaking. Among the forces that may be exerted on the EUV pellicle surface, mechanical vibrations induced during pellicle handling may be severe pellicle yield detractors. For example, friction between pellicle-holding articles (e.g., wafer boat) and a pellicle frame may create small mechanical perturbations that can easily break the pellicle.

In some embodiments, a material of choice for supporting a pellicle frame during wet etching of a silicon wafer to produce large-area ultrathin pellicles may include all-glass hardware, as all-glass hardware has good corrosion-resistance towards, for example, hot concentrated Potassium Hydroxide (KOH) (e.g., which may be employed during etching), and may be perfectly wetted by an aqueous etchant (e.g., thereby eliminating the undesirable formation of gas bubbles on the surface of such articles). Once dislodged, gas bubbles may cause an unwanted perturbation on the free-standing membrane upon buoying to the liquid surface. All-glass materials also may exhibit the low static charging characteristics of, for example, quartz, as opposed to other corrosion-resistant materials (e.g., Polytetrafluoroethylene (PTFE) (e.g., forms of Teflon™), Perfluoroalkoxy (PFA), Polymonochlorotrifluoroethylene (KEL-F), and as such, may prevent membrane failure due to electrostatic build-up according to some embodiments. It is therefore desirable to physically separate and isolate the pellicle from the glass holding article to, for example, prevent rubbing of the pellicle frame against the holding piece according to various embodiments of the present principles.

In one embodiment, another force that may act as a pellicle yield detractor may include the presence of a lateral capillary meniscus force, which may be operative at the liquid-gas-solid boundary on both (or either) side of the immersed (or partially immersed) membrane between an EUV pellicle and neighboring surfaces. This additional lateral force may arise because of the deformation of the otherwise flat liquid surface (e.g., due to the presence of the membrane), and can pull together curved (or flat) immersed (or partially immersed) objects located in a proximal range spanning from micrometer to millimeter distances.

In some embodiments, the present principles may be employed to mount and/or wet-process one or more EUV pellicles without introducing any mechanical friction on the pellicle frame while positioning the one or more EUV pellicles at a small distance (e.g., 10-20 millimeters) away from neighboring surfaces (e.g., to prevent the lateral capillary force from disrupting the mechanical stability of the suspended membrane (e.g., EUV pellicle)).

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip and/or EUV pellicle, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements (e.g., SiN). These compounds include different proportions of the elements within the compound (e.g., SiN includes $Si_xNi_{1-x}$ where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an exemplary system 100 employing a pellicle (e.g., extreme ultraviolet (EUV) pellicle) 108 is illustratively depicted in accordance with an embodiment of the present principles. In an embodiment, one or more EUV pellicles 108 may be attached to a frame 104, and may act as a barrier to keep particles 109 (e.g., contamination) away from an imaging (e.g., focal) plane 106 while allowing EUV light 110 to pass through when performing imaging of, for example, an EUV mask 102. In an embodiment, an EUV pellicle 108 may include a large area-to-thickness unsupported membrane that is extremely fragile and sensitive to stress (e.g., in terms of force applied to a particular cross-sectional area of the pellicle 108.

In various embodiments, an EUV pellicle 108 may be fabricated from a plurality of materials according to the present principles. For example, an EUV pellicle 108 may be fabricated from ultra-thin polysilicon (e.g., 50 nm thick) or silicon nitride (e.g., 15 nm thick), although other materials may be employed according to various embodiments of the present principles.

Figure 2:
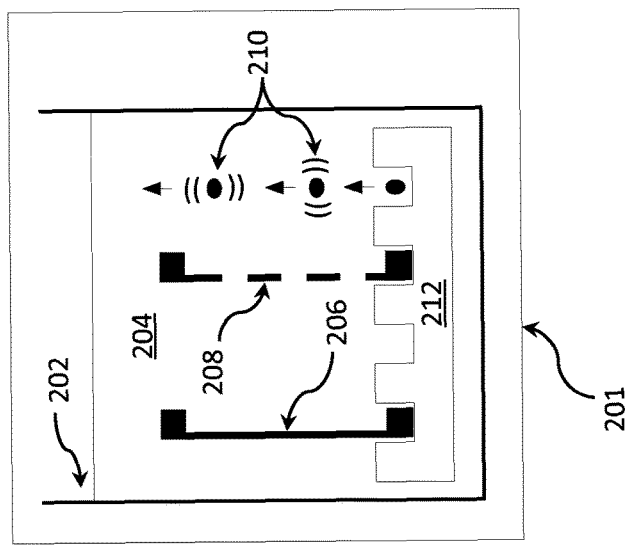
FIG. 2 shows a diagram illustratively depicting exemplary mechanical perturbations in a system for pellicle (e.g., EUV pellicle) fabrication, in accordance with one illustrative embodiment of the present principles.
Figure 2:
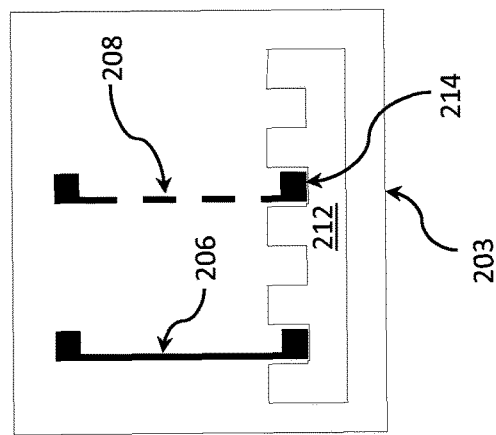
Figure 2:
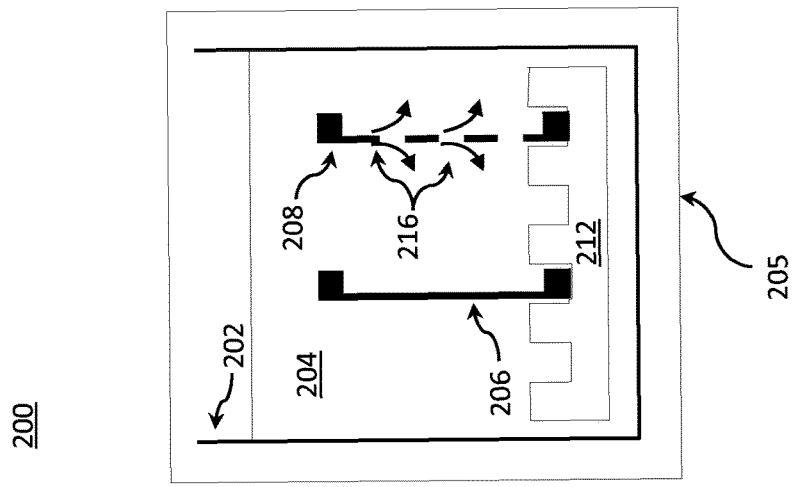

Referring now to FIG. 2, a diagram illustratively depicting exemplary mechanical perturbations in systems 201, 203, and 205 for pellicle (e.g., EUV pellicle) fabrication is shown in accordance with various illustrative embodiments of the present principles. EUV pellicles may be fabricated using a subtractive (e.g., wet etch) process, and mechanical perturbations may be controlled during pellicle fabrication to prevent pellicle failure (e.g., breakage) according to the present principles.

In one embodiment, the system 201 may include a container 202, a rinse bath solution 204 (e.g., deionized water (DI $H_2O$)), a holder 212 (e.g., KEL-F, glass, etc.), and one or more pellicles 206 and 208 according to the present principles. During pellicle formation, a failure during wet etching may occur from pressure waves induced by gas bubbles 210 (e.g., bubbles dislodged from hydrophobic surfaces), which may cause failure (e.g., breakage) of a neighboring pellicle 208. In one embodiment, employing a hydrophilic pellicle holder 212 according to the present principles may prevent pellicle failure.

In another embodiment, the system 203 may include a holder 212 (e.g., KEL-F, glass, etc.) and one or more pellicles 206 and 208. During handling, a failure (e.g., breaking) of a pellicle 208 may occur (e.g., because of vibrations from friction between the pellicle frame and edges of the pellicle holder 214). In another embodiment, the system 205 may include a container 202, a rinse bath solution 204 (e.g., (DI $H_2O$), aqueous potassium hydroxide (KOH(aq)), etc.) a holder 212 (e.g., KEL-F, glass, etc.), and one or more pellicles 206 and 208 according to the present principles. During pellicle formation, if a pellicle 208 breaks, particles 216 (e.g., debris) from the failed pellicle 208 may contaminate other pellicles 206 (e.g., intact pellicles) in the rinse bath 204. In some embodiments, baffle glass wafers (not shown), as described in further detail herein below, may be placed between pellicles (e.g., between pellicles 206 and 208) to prevent any contamination of intact pellicles 206 from debris 216 from any failed (e.g., broken) pellicles 208 according to the present principles.

Figure 3:
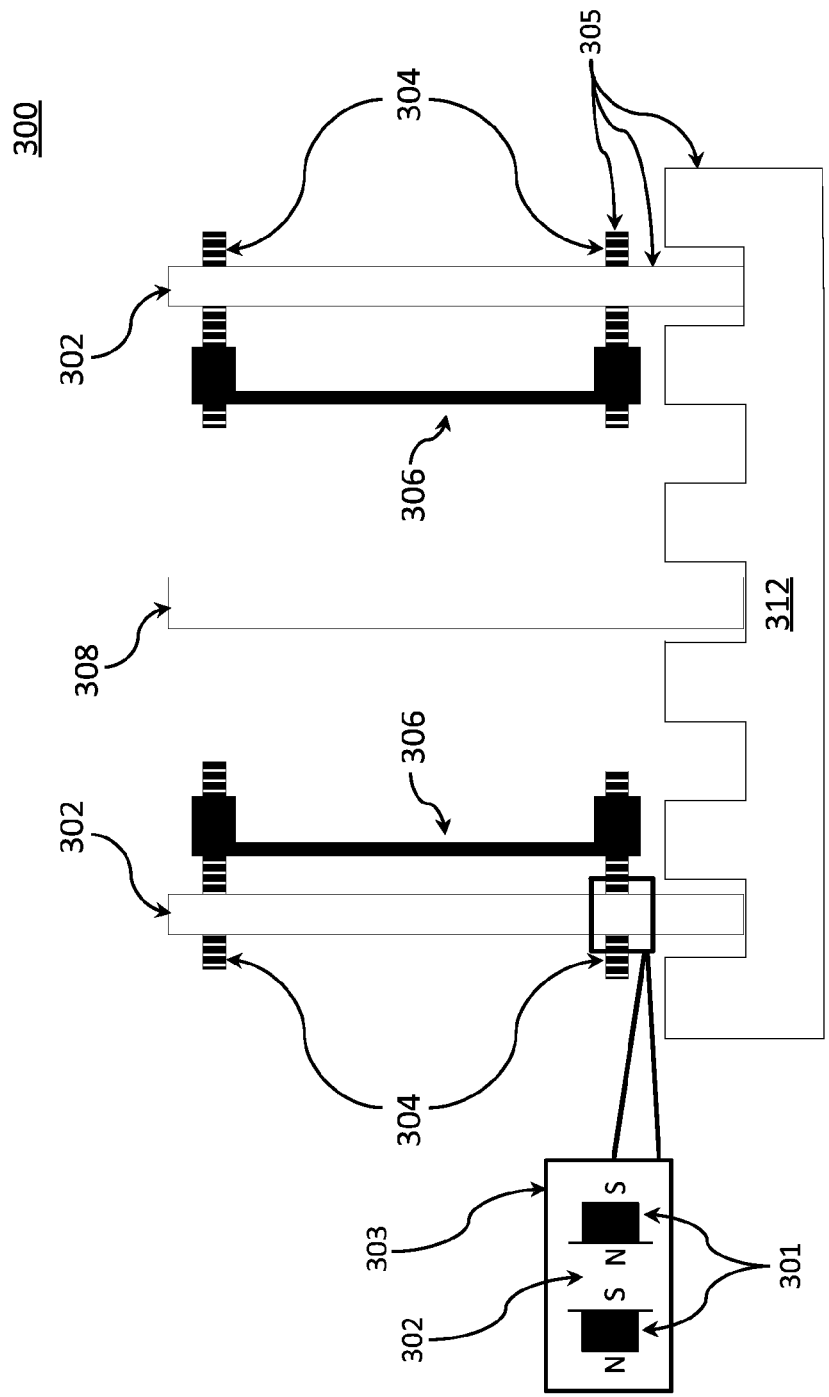
FIG. 3 shows an exemplary system for controlling mechanical perturbations during pellicle (e.g., EUV pellicle) fabrication, in accordance with one illustrative embodiment of the present principles.

Referring now to FIG. 3, an exemplary system 300 for controlling mechanical perturbations during pellicle (e.g., EUV pellicle) fabrication is illustratively depicted in accordance with one illustrative embodiment of the present principles. In one embodiment, the system 300 may include one or more glass holders 312 (e.g., quartz holders), one or more glass wafers 302, and/or two or more magnets 301 (e.g., FeNdB (rare-earth magnets)), which may be arranged in one or more magnet stacks 304 (e.g., magnet stack beams) to attach one or more pellicles 306 (e.g., EUV pellicles) to the glass wafers 302 according to the present principles. The magnets 301 may be of substantially uniformly sized dimensions (e.g., uniform cross-sections), and the substantially uniformly sized magnets 301 may be stacked evenly to form magnet stacks 304 with substantially smooth side faces according to one embodiment of the present principles. It is noted that the magnets 301 in the magnet stacks 304 may be non-uniformly sized according to some embodiments of the present principles.

While many aspects of system 300 are described in singular form for the sake of illustration and clarity, the same can be applied to multiples ones of the items mentioned with respect to the description of system 300. For example, while a single holder 312 is mentioned with, more than one holder 312 may be used in accordance with the teachings of the present principles. Moreover, it is appreciated that the holder 312 is but one aspect involved with system 300 than can be extended to plural form.

In some embodiments, employing magnet stacks 304 according to the present principles may prevent propagation of any mechanical vibrations (e.g., generated on the glass wafers 302) from reaching and/or affecting the pellicles 306 (or pellicle frame 305), as mechanical vibrations do not efficiently propagate through the magnet stack 304. In some embodiments, the magnets 301 may include rare-earth magnets (e.g., neodymium (Nd), dysprosium (Dy), compounds (e.g., FeNdB), etc.), and may exhibit strong magnetic fields. The magnets 301 may be coated (e.g., with nickel) for a plurality of purposes (e.g., resistance to KOH etchant, hydrophilic properties, etc.) according to various embodiments of the present principles. In one embodiment, the magnets 301 in the magnet stacks 304 may be assembled together by alternating their magnetic poles (e.g., +−+−+− . . . ), as illustratively depicted in an exploded view 303 of a portion of the glass wafer 304 and the magnet stack 304 according to the present principles.

In one embodiment, the pellicles 306 connected to the glass wafers 302 using magnet stacks 304 may be positioned to be separated from the holder 312 (e.g., quartz holder) so that the pellicles 306 do not contact the holder 312. The glass wafers 302 may be in contact with the holder 312, and the pellicles 306 may be suspended from the wafers 302 using magnets 301 in the magnet stack 304 so that the pellicles 306 do not touch the holder 312 according to some embodiments of the present principles according to some embodiments of the present principles.

In one embodiment, the pellicles 306 may be separated by one or more baffle wafers/barriers 308 (e.g., baffle glass wafers, dummy wafers, etc.). The baffle wafers/dividers 308 may be interposed between two or more pellicles 306 to prevent any debris (e.g., particles) from any pellicles which may have failed (e.g., broken) during fabrication from contaminating any unbroken pellicles 306 according to the present principles. In some embodiments, the baffle wafers/barriers 308 may be employed in the system 300 in conjunction with the magnets 301 in the magnet stacks 304 for holding the pellicles 306, but the baffle wafers/barriers 308 may also be employed in systems using conventional holders/frames (not shown) according to the present principles.

In some embodiments, the glass wafers 302, magnet stacks 304, and the quartz holder 312 may be collectively referred to as a frame 305, and the glass wafers may be attached to the quartz holder by inserting the glass wafer in the quartz holder grooves, the grooves being provided at different locations in the quartz holder so that the glass wafers may be supported at multiple points around their perimeter, according to the some embodiments of the present principles.

Figure 4:
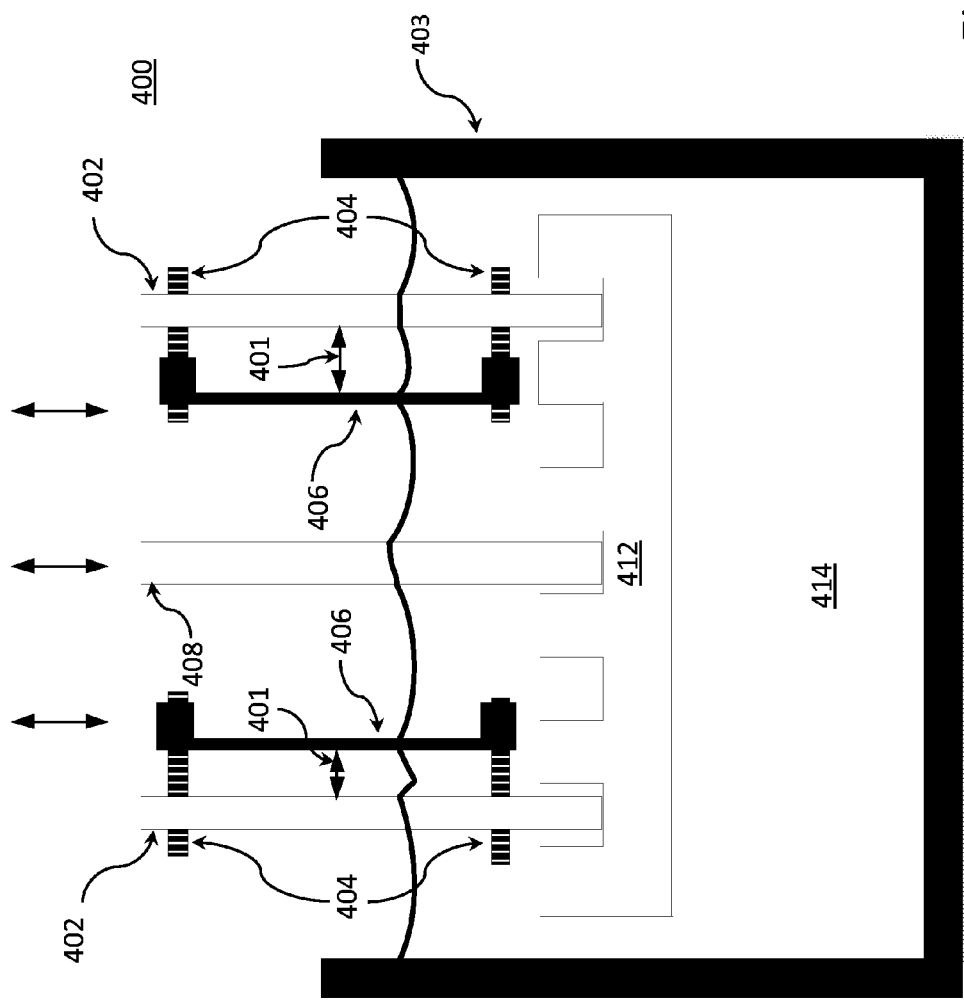
FIG. 4 shows an exemplary system/method for controlling mechanical perturbations during pellicle (e.g., EUV pellicle) fabrication, in accordance with one illustrative embodiment of the present principles.

Referring now to FIG. 4, an exemplary system/method 400 for controlling mechanical perturbations during pellicle (e.g., EUV pellicle) fabrication is illustratively depicted in accordance with one embodiment of the present principles. In one embodiment, the system 400 may include one or more containers 403, a rinse bath solution 414 (e.g., KOH, DI $H_2O$, etc.), one or more glass holders 412 (e.g., quartz holders), one or more glass wafers 402, and/or two or more magnets (e.g., FeNdB (rare-earth magnets)) arranged in one or more magnet stacks 404 to attach one or more pellicles 406 (e.g., EUV pellicles) to the glass wafers 402 according to the present principles.

In some embodiments, employing magnet stacks 404 according to the present principles may prevent propagation of any mechanical vibrations (e.g., generated on the glass wafers 402) from reaching and/or affecting the pellicles 406 (or pellicle frame), as mechanical vibrations do not efficiently propagate through the magnet stack 404. In some embodiments, the magnets in the magnet stack 404 may include rare-earth magnets (e.g., neodymium (Nd), dysprosium (Dy), compounds (e.g., FeNdB), etc.), and may exhibit strong magnetic fields. The magnets in the magnet stacks 404 may be coated (e.g., with nickel) for a plurality of purposes (e.g., resistance to KOH etchant, hydrophilic properties, etc.) according to various embodiments of the present principles.

In one embodiment, the magnets in the magnet stacks 404 may be assembled together by alternating their magnetic poles (e.g., +−+−+− . . . ), as illustratively depicted in element 303 of FIG. 3, according to the present principles. The magnet stacks 404 may be employed to create a gap space 401 between the pellicle 406 and the glass wafers 402, with the gap space 401 ranging from, for example, 10-20 mm according to various embodiments. The formation of a minimum gap space 401 using the magnet stacks 404 compensates for any lateral capillary meniscus forces (e.g., induced by the presence of nearby surfaces (e.g., glass wafer, baffle, etc.) during fabrication of the pellicles 406 according to the present principles. If a minimum gap space 401 (e.g., minimum gap space may be dependent on the pellicle material and/or the composition of the rinse bath solution 414) is not employed, pellicles 406 may be broken, for example, during removal of the pellicles 406 from a rinse bath 414 because of, for example, lateral capillary meniscus forces acting on the pellicles 406 (e.g., induced by the presence of nearby surfaces) during immersion and/or removal of the pellicles 406 from the rinse bath 414.

In one embodiment, the pellicles 406 attached to the glass wafers 402 using magnet stacks 404 may be separated from the holder 412 (e.g., quartz holder) so that the pellicles 406 do not contact the holder 412. The glass wafers 402 may be in direct contact with the holder 412, and the pellicles 406 may be suspended from the wafers 402 using a magnet stack 404 so that the pellicles 406 do not touch the holder 412 according to some embodiments. This separation may minimize mechanical forces (e.g., vibrations) from immersion or removal of the pellicles 406 according to the present principles.

In one embodiment, the pellicles 406 connected to the glass wafers 402 using magnet stacks 404 may be separated from the holder 412 (e.g., quartz holder) so that the pellicles 406 do not contact the holder 412. The glass wafers 402 may be in direct contact with the holder 412, and the pellicles 406 may be suspended from the wafers 402 using the magnet stack 404 according to some embodiments of the present principles.

In one embodiment, the pellicles 406 connected to the glass wafers 402 using magnet stacks 404 may be separated from other pellicles 406 by insertion of one or more baffle wafers/barriers 408 (e.g., baffle glass wafers, dummy wafers, etc.) between two or more pellicles 406. The baffle wafers/dividers 408 may be interposed between two or more pellicles 406 to prevent any debris (e.g., particles) from any pellicles which may have failed (e.g., broken) during fabrication from contaminating any unbroken pellicles 406 according to the present principles. In some embodiments the baffle wafers/barriers 408 may be employed in the system/method 400 in conjunction with the magnets in the magnet stacks 404 for holding the pellicles 406, but the baffle wafers/barriers 408 may also be employed in systems using conventional holders/frames (not shown) according to the present principles.

Figure 5:
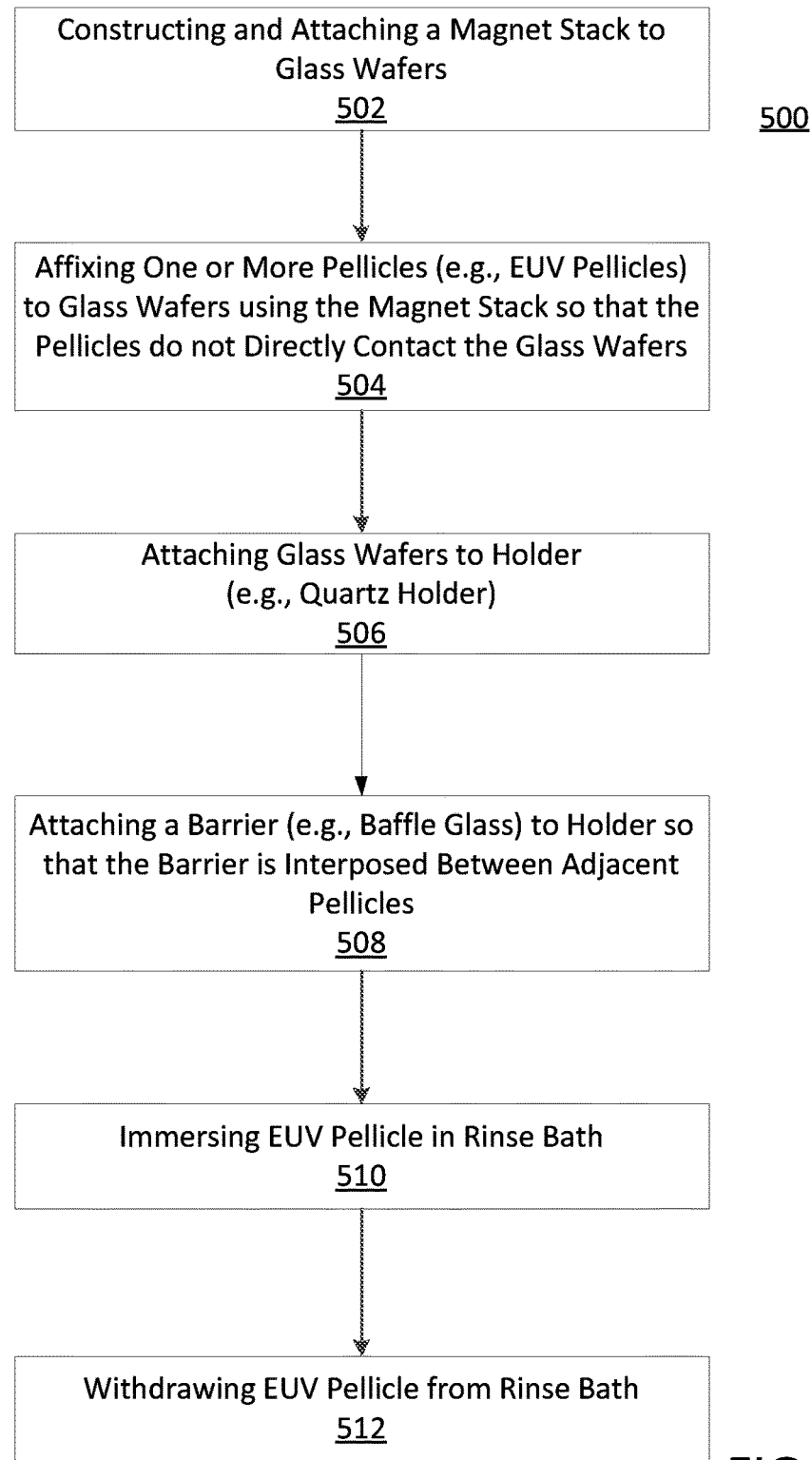
FIG. 5 is a block/flow diagram illustratively depicting a method for controlling mechanical perturbations during pellicle (e.g., EUV pellicle) fabrication, in accordance with one illustrative embodiment of the present principles.

Referring now to FIG. 5, a block/flow diagram illustratively depicting a method 500 for controlling mechanical perturbations during pellicle (e.g., EUV pellicle) fabrication is illustratively depicted in accordance with one embodiment of the present principles. In one embodiment, a magnet stack, including two or more magnets, may be constructed and affixed to the glass wafers in block 502. For example, a magnet may be placed on one side of the glass wafer, and another magnet may be placed on the other side of the wafer such that the magnetic fields align (e.g., alternating and the magnets stay in place on either side of the glass wafers.

In some embodiments, more than two magnets may be employed in the magnet stack (e.g., dependent on a desired gap space), and the magnets in the magnet stack may be assembled together by alternating their magnetic poles (e.g., +-+-+- . . . ) in block 502 according to the present principles. One or more pellicles (e.g., EUV pellicles) may be affixed to the glass wafers using the magnet stack so that the pellicles do not directly contact the glass wafers in block 504. In one embodiment, the magnets in the magnet stack may be arranged in block 504 to create a gap space (e.g., 10-20 mm) between the pellicles and the glass wafers according to the present principles. In one embodiment, one or more glass wafers may be affixed to a holder (e.g., quartz holder) in block 506.

In block 508, a barrier (e.g., baffle glass wafers, dummy wafers, etc.) may be interposed between adjacent pellicles to separate the pellicles and to prevent any debris (e.g., particles) from any pellicles which may have failed (e.g., broken) during fabrication from contaminating any unbroken pellicles according to one embodiment of the present principles. In some embodiments the baffle wafers/barriers may be employed in conjunction with the magnets in the magnet stacks for holding the pellicles according to the present principles, but the baffle wafers/barriers may also be employed in systems using conventional holders/frames (not shown) according to various embodiments of the present principles. Furthermore, the magnet stacks for holding the pellicles according to the present principles may also be effectively employed without the barrier attached in block 508 according to some embodiments.

In block 510, the pellicles (and the holding system, as shown in detail in element 400 of FIG. 4) may be immersed in a rinse bath (e.g., DI $H_2O$, KOH, etc.), and the pellicles (and the holding system, as shown in detail in element 400 of FIG. 4) may be withdrawn from the rinse bath in block 512 for drying according to one embodiment of the present principles.

Having described preferred embodiments of a system and method for mechanical isolation control for an extreme ultraviolet (EUV) pellicle (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A system for holding a membrane, comprising:
a plurality of magnets of uniform dimensions formed into two or more magnet stack beams for connecting the membrane to a substantially vertical substrate wafer, the magnets being positioned substantially parallel on opposite sides of the wafer and providing a gap between the wafer and the membrane when the membrane is connected; and
a substrate holder, positioned substantially perpendicular to the wafer and including a recess configured to receive the wafer, wherein the magnet stack beams are positioned on the wafer so that a space is present between the membrane and the substrate holder when the membrane is connected for rinsing.

2. The system of claim 1, wherein the wafer is a hydrophilic silicon dioxide substrate wafer and the substrate holder is a hydrophilic silicon dioxide substrate holder.

3. The system of claim 1, wherein the gap is between about 10 and about 20 millimeters.

4. The system of claim 1, further comprising one or more barriers connected to the holder, the one or more barriers being interposed between two or more adjacent membranes.

5. The system of claim 1, wherein the magnets in the magnet stack beams are connected by positioning the magnets so that the magnetic poles alternate.

6. The system of claim 1, wherein the magnets in the magnet stack beams are disposed on opposite sides of the wafer and the membrane so that the wafer and membrane are held substantially perpendicular to the holder by the magnet stack beams.

7. A system for isolating a membrane during fabrication, comprising:
a membrane connected to a substantially vertical substrate wafer using a plurality of magnets of uniform dimensions formed into two or more magnet stack beams, the magnets being positioned substantially parallel on opposite sides of the wafer and providing a gap between the wafer and the membrane; and
a substrate holder, positioned substantially perpendicular to the wafer and including a recess configured to receive the wafer connected to the membrane by the magnet stack beams, the magnet stack beams being positioned on the wafer so that a space is present between the membrane and the substrate holder.

8. The system of claim 7, wherein the membrane is an extreme ultraviolet (EUV) pellicle.

9. The system of claim 7, wherein the wafer is a hydrophilic silicon dioxide substrate wafer and the substrate holder is a hydrophilic silicon dioxide substrate holder.

10. The system of claim 7, wherein the gap is between about 10 and about 20 millimeters.

11. The system of claim 7, further comprising one or more barriers connected to the holder, the one or more barriers being interposed between adjacent pellicles.

12. The system of claim 7, wherein the magnets in the magnet stack beams are connected by positioning the magnets so that the magnetic poles alternate.

13. The system of claim 7, wherein the magnets in the magnet stack beams are disposed on opposite sides of the wafer and the membrane so that the wafer and membrane are held substantially perpendicular to the holder by the magnet stack beams.

14. A system for holding a membrane, comprising:
a plurality of magnets formed into two or more magnet stack beams to connect a membrane to a substantially vertical substrate wafer, the magnets being positioned substantially parallel on opposite sides of the wafer and providing a gap between the wafer and the membrane; and
a substrate holder, positioned substantially perpendicular to the wafer and including a recess configured to receive the wafer, wherein the magnet stack beams are positioned on the wafer so that a space is present between the membrane and the substrate holder.

15. The system of claim 14, wherein the wafer is a hydrophilic silicon dioxide substrate wafer and the substrate holder is a hydrophilic silicon dioxide substrate holder.

16. The system of claim 14, further comprising one or more barriers connected to the holder, the one or more barriers being interposed between two or more adjacent membranes.

17. The system of claim 14, wherein the magnets in the magnet stack beams are connected by positioning the magnets so that the magnetic poles alternate.

18. The system of claim 14, wherein the magnets in the magnet stack beams are disposed on opposite sides of the wafer and the membrane so that the wafer and membrane are held substantially perpendicular to the holder by the magnet stack beams.

19. The system of claim 4, wherein the membranes are extreme ultraviolet (EUV) pellicles.

20. The system of claim 16, wherein the membranes are extreme ultraviolet (EUV) pellicles.

* * * * *